United States Patent [19]

Altoz et al.

[11] Patent Number: 4,934,154
[45] Date of Patent: Jun. 19, 1990

[54] APPARATUS FOR COOLING ELECTRONIC COMPONENTS IN AIRCRAFT

[75] Inventors: Frank E. Altoz, Baltimore; John D. McClure, Annapolis, both of Md.

[73] Assignee: The United States of America as represented by the Secretary of the Navy, Washington, D.C.

[21] Appl. No.: 304,048

[22] Filed: Jan. 25, 1989

[51] Int. Cl.⁵ .............................................. F28B 9/00
[52] U.S. Cl. ......................................... 62/87; 62/172; 62/197
[58] Field of Search .................. 62/61, 117, 241, 402, 62/197, 172, 87; 98/1, 5

[56] References Cited

U.S. PATENT DOCUMENTS

| | | | |
|---|---|---|---|
| 2,391,838 | 12/1945 | Kleinhans et al. | 62/241 X |
| 2,412,110 | 12/1946 | Williams, Jr. | 62/172 |
| 2,453,923 | 11/1948 | Mayo | 62/61 |
| 2,473,496 | 6/1949 | Mayer | 62/172 |
| 2,669,101 | 2/1954 | Shields | 62/241 |
| 2,706,255 | 4/1955 | Breaux et al. | 244/58 |
| 2,767,561 | 10/1956 | Seeger | 62/402 X |
| 2,870,964 | 1/1959 | Lindbom | 62/197 |
| 2,916,890 | 12/1959 | Stein | 62/172 X |
| 2,948,518 | 8/1960 | Kraus | 62/241 X |

Primary Examiner—William E. Wayner
Attorney, Agent, or Firm—Susan E. Verona; James B. Bechtel; James V. Tura

[57] ABSTRACT

A ram air cooling system for cooling electronic components in an aircraft provides automatic switching from a high ram air speed cooling mode (ACM) to a low ram air speed cooling mode (RAM). The cooling system receives variable speed ram air during the flight of the aircraft and includes an automatically controlled valve for either directing high speed ram air to a precooling means prior to cooling the electronic components or directing low speed ram air directly to the electronic components without precooling. The automatically controlled valve is controlled by programmable logic module means for comparing the cooling efficiency of the electronic components by precooled ram air with the cooling efficiency of the electronic components by the non-precooled ram air. The cooling efficiencies are calculated from temperature measurements of the ram air at several locations in the system of the invention. Preferably, the ram air cooling means is an air turbine which extracts energy from the ram air to drive a compressor that compresses and discharges heated air that exits from the housing for the electronic components after the ram air has performed its cooling function.

19 Claims, 3 Drawing Sheets

APPARATUS FOR COOLING ELECTRONIC COMPONENTS IN AIRCRAFT

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION

The universal use of electronic systems in aircraft for a multiplicity of purposes requires that the electronic components are maintained at suitable operating temperatures to assure proper performance and to contribute to long term reliability.

One known approach to cooling airborne electronic components makes use of ram air that the aircraft receives during flight, for example as disclosed in U.S. Pat. No. 2,706,255. However, this known approach does not make optimum use of the cooling capabilities of the ram air. More specifically, the cooling capabilities of ram air during relatively low speed flight are significantly different from the cooling capabilities of ram air during high speed flight. Yet, this known approach does not take advantage of special features of high speed ram air for cooling. Other known uses of ram air involve using the ram air to perform both heating and cooling functions to maintain desired cabin temperatures and pressures. Such uses are disclosed in U.S. Pat. Nos. 2,412,110, 2,473,496, 2,669,101, 2,767,561, and 2,916,890. In none of the known uses of ram air is advantage taken of special capabilities of high speed ram air for cooling electronic components in the aircraft.

More specifically, an air turbine may be used to extract useful work from ram air and thereby precool the ram air prior to cooling the electronic components. The turbine cooling capacity is a function of available ram pressure in accordance with the following formula:

$$P_{Ram} = P_o[1 + .2M^2]^{3.5}$$

where $P_{Ram}$ is available ram pressure, $P_o$ is ambient pressure, and M is Mach number or aircraft speed.

Thus, at relatively high aircraft speeds, cooling capacity of the ram air is relatively high.

Conversely, at relatively low aircraft speeds, ram pressure for driving an air turbine is reduced along with corresponding ram air flow. At lower speeds, better cooling of electronic components can be achieved if the turbine is bypassed and the electronic components are cooled by ram air directly.

In view of the relationship between aircraft speed and ram air pressure, it would be desirable to provide an apparatus for cooling electronic components in an aircraft that takes advantage of the higher cooling capabilities of ram air during high speed flight.

Furthermore, because aircraft speed can vary over a wide range, it would be desirable to provide an apparatus for cooling electronic components in an aircraft that permits automatic switching from a high speed cooling mode to a low speed cooling mode and vice versa.

SUMMARY OF THE INVENTION

Accordingly, it is a primary object of the invention to provide an apparatus for cooling electronic components in aircraft that takes advantage of the higher cooling capabilities of ram air during high speed flight.

Another object of the invention is to provide an apparatus for cooling electronic components in an aircraft that provides automatic switching from a high speed cooling mode to a low speed cooling mode and vice versa.

Briefly these and other objects are accomplished by a novel cooling system for cooling electronic components in an aircraft in flight which provides automatic switching from a high speed ram air cooling mode to a low speed ram air cooling mode. The cooling system of the invention receives variable speed ram air during flight and is characterized by an automatically controlled valve for switching between two cooling modes, one mode for conducting relatively low speed ram air directly to the electronic components for cooling thereof, and the other mode for conducting relatively high speed ram air to a means for precooling the ram air prior to cooling the electronic components.

The system of the invention is further characterized in including means for comparing the cooling efficiency of the electronic components directly by non-precooled ram air (direct mode or RAM mode) with the cooling efficiency of the electronic components by precooled ram air (precooled mode or ACM mode). The cooling efficiency comparing means ascertains which ram air mode is more efficient in cooling the electronic components and then controls the automatically controlled valve to select either the direct mode or the precooled mode to provide most efficient cooling of the electronic components.

Electronic components are often associated with heat sinks that have fins to promote heat dissipation. Such heat sinks and fins are often termed "cold plates." Cooling efficiencies may be represented by calculated "cold plate temperatures" that represent calculated temperatures of the cold plates used for cooling the electronic components. The cooling efficiencies take into account a variety of factors including changes in heat transfer efficiency caused by air flow variations.

The actual temperatures of the electronic components or their associated cold plate heat dissipators need not be measured. The cooling efficiencies are calculated by programmed algorithms in a logic module that receives temperature measurements of the ram air at several locations in the system but not inside the housing for the electronic components. Since the temperature sensors are not located inside the housing for the electronic components, no modifications to the electronic components or their housing is required. The cooling mode selection is made automatically by the programmed logic module whose program can be changed easily to alter the optimum point at which either direct mode or precooled mode selection is made.

Preferably, the ram air precooling means is an air turbine which extracts energy from the ram air to drive an air compressor. The air that leaves the turbine has been expanded and cooled when the useful work is extracted from that air to drive the compressor. The compressor receives heated air that exits from the housing for the electronic components after the ram air has performed its cooling function and compresses the exit air prior to discharge of the exit air from the cooling system of the invention. The arrangement of air turbine and air compressor for precooling ram air and compressing ram air subsequent to cooling the electronic components is referred to as an air cycle machine (ACM).

Although variable velocity ram air is the cooling fluid disclosed for cooling electronic components in an aircraft, the principles of the invention can be employed with other variable velocity cooling fluids in other cooling environments.

Several key advantages are obtained by following the principles of the invention. The invention provides an apparatus for cooling electronic components in an aircraft that takes advantage of the higher cooling capabilities of ram air during high speed flight. Furthermore, the invention provides an apparatus for cooling electronic components in an aircraft that automatically switches from using high speed ram air to using low speed ram air and vice versa for cooling the electronic components. In addition, since the temperature sensors used with the system are not located inside the housing for the electronic components, no modifications to the electronic components or their housing is required. Also, since the mode selection between high speed air and low speed air is based upon programmed computations of cooling efficiency, the actual crossover points of mode selection can be modified by simply changing the programmed computations without changing the structural components of the system.

Other objects, advantages and novel features of the invention will become apparent from the following detailed description of the invention when considered in conjunction with the accompanying drawings herein.

DESCRIPTION OF THE PREFERRED EMBODIMENT

Figure 1:
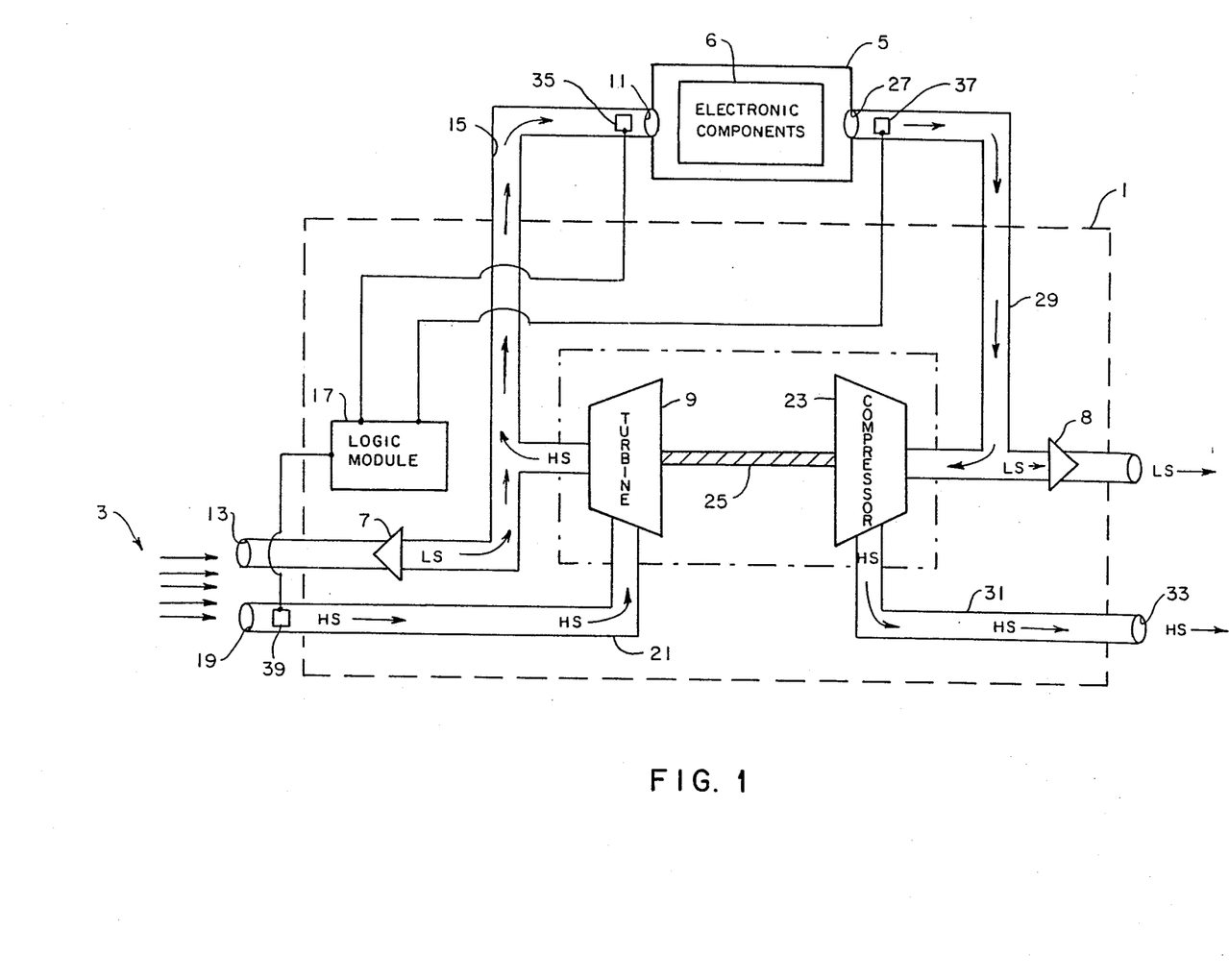
FIG. 1 is a schematic diagram of an embodiment of a cooling system of the invention.

With reference to FIG. 1, an embodiment of a cooling system 1 of the invention employs a supply of a variable velocity ram air 3 for cooling electronic components 6. The cooling system 1 includes an automatically controlled valve 7 for selectively conducting ram air 3 directly to electronic components 6 or conducting ram air 3 to an energy extracting turbine 9 for precooling the ram air 3 prior to contact with the electronic components 6. The controlled valve 7 may be actuated by a solenoid (not shown) or other suitable electrically controlled means.

Ram air 3 can reach an intake orifice 11 of a housing 5 for the electronic components 6 by one of two routes. Low speed ram air 3 (depicted by arrows with an "LS" on the tail) reaches the electronic components 6 by the following route: ram air 3 enters low speed intake orifice 13, passes through normally open valve 7, passes through conduit 15, and through component housing intake orifice 11. Arrows without either an "LS" or a "HS" on the tail represent either low speed or high speed ram air 3.

On the other hand (as explained below in greater detail), high speed ram air 3 (depicted by arrows with an "HS" on the tail) causes the normally open valve 7 to automatically close utilizing logic module 17. Thereupon, high speed ram air 3 reaches the electronic components 6 by the following route. Ram air 3 is precluded from entering the cooling system 1 through closed valve 7 and bypasses valve 7 to be in essence diverted to high speed intake orifice 19. The diverted air passes through conduit 21, into turbine 9, out from turbine 9, into conduit 15, and through electronic component housing intake orifice 11. As the high speed ram air 3 passes through and drives the turbine 9, the air expands, and its temperature drops which serves to precool the ram air 3 prior to contact with the electronic components 6. The temperature drop occurs because energy is extracted from the high speed ram air 3 as the air drives the turbine 9 and compressor 23 attached thereto by shaft 25.

As the cooling ram air 3 contacts the electronic components 6 and performs its cooling function, the air itself receives heat and is warmed to a certain extent. The warmed air exits from housing outlet orifice 27 and proceeds down conduit 29 to the compressor 23. The air exits from the compressor 23 to conduit 31 and exits the cooling system 1 at outlet 33.

When the cooling system 1 is in a low speed cooling mode, the air pressures at the inlet and outlet of the turbine 9 are equal and consequently, there is no flow through the turbine 9. Therefore, the compressor 23 does not rotate, and its resistance to airflow may be considerable. The pressure difference across check valve 8 permits air to exit through check valve 8 rather than compressor 23. However, when the cooling system 1 is in the high speed mode, the air passing through turbine 9 causes the compressor 23 to rotate and compress the air before it is expelled through outlet 33. Check valve 8 closes in the high speed mode because pressure there across is reversed relative to the low speed mode.

The logic module 17 which automatically controls the valve 7 receives data inputs and performs calculations employing those inputs in order to make decisions with respect to whether the automatically controlled valve 7 should remain open or should be closed by the module 17. The data input to the logic module 17 comes from three temperature sensors. The first temperature sensor 35 provides inlet temperature measurement (Temp.1) to the logic module 17 and is located just prior to the housing intake orifice 11.

The second temperature sensor 37 provides outlet temperature measurement (Temp.2) to the logic module 17 and is located near the housing outlet orifice 27 of the housing 5 of the electronic components 6. The outlet temperature (Temp.2) represents the temperature of the air after it has cooled the electronic components 6.

The third temperature sensor 39 provides intake ram air temperature measurement (Temp.3) to the logic module 17 and is located at the ram air intake 19 and measures the temperature of the ram air 3 before entering the cooling system 1.

The logic module 17 performs computations to ascertain whether the cooling system 1 should assume the low ram air speed mode (direct mode or RAM mode) or the high ram air speed mode (precooled mode or ACM mode). When the low ram air speed mode is indicated, the valve 7 remains open. However, when the high speed mode is indicated, the valve 7 is automatically closed by the logic module 17.

Figure 2:
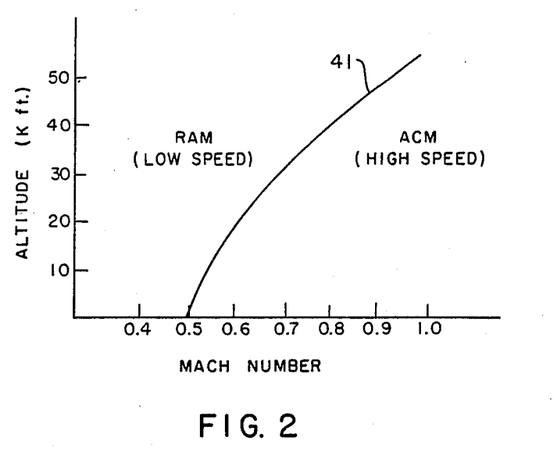
FIG. 2 is a graph depicting the relationship between aircraft speed, aircraft altitude, and the operating regions of the low ram air speed cooling mode (RAM) and the high ram air speed cooling mode (ACM)

FIG. 2 graphically shows a relationship between the low ram air speed cooling mode (RAM) and the high ram air speed cooling mode (ACM) plotted on a grid of altitude versus aircraft speed for a thermal model of an electronic pod that was employed. Line 41 is the boundary between the two cooling regions; in other words line 41 represents values for which cooling efficiency in the RAM mode and cooling efficiency in the ACM mode are equal. The RAM cooling region is shown in the shaded area to the left of line 41. The ACM cooling region is shown in the shaded area to the right of line 41.

In FIG. 2 it is noted that at low altitudes (e.g. up to approximately 20,000 feet), the boundary between "low" speed ram air 3 and "high" speed ram air 3 is in a range of approximately 0.5 to 0.6 Mach. However, at higher altitudes (e.g. from 40,000 to 50,000 feet), the boundary between "low" speed ram air 3 and "high" speed ram air 3 is in a higher range of approximately 0.9 to 1.0 Mach. Thus what is considered "low" or "high" speed ram air 3 is relative and is dependent upon the altitude at which the aircraft is flying.

It is noted further in FIG. 2 that at zero altitude, the boundary between "low" and "high" is shown to be approximately 0.5 Mach. This speed value as boundary between low speed and high speed is somewhat arbitrary and depends upon the specific parameters of the specific thermal model that was employed. Other thermal models having different air flow parameters and different heat transfer parameters would provide boundary lines that differ from line 41 in both location and shape. More specifically, the exact location and shape of the boundary line 41 depend upon numerous parameters such as the size of the conduits 15 and 21, the size of the air turbine 9, the quantity of heat generated by the electronic components 6, the size of heat dissipating cold plates for cooling the electronic components 6, air flow characteristics inside the housing for the electronic components 6, etc. that can be specified for an actual embodiment of the cooling system 1 of the invention.

Figure 3:
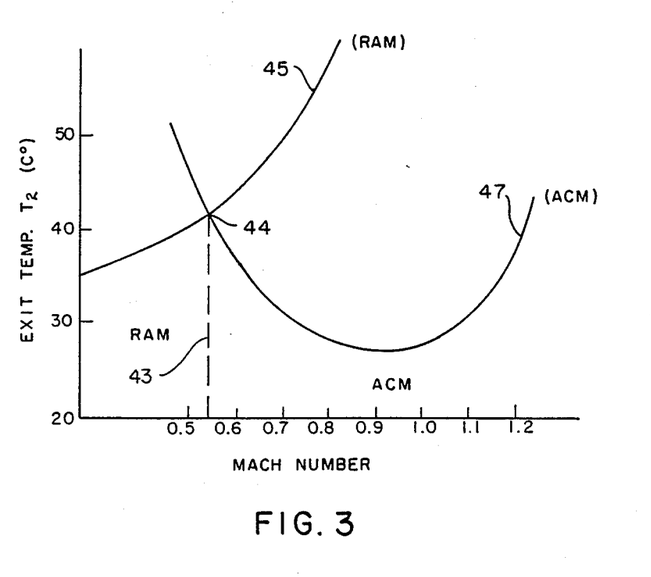
FIG. 3 is a graph depicting the relationship between aircraft speed, the exit temperature (Temp.2) of air leaving the housing of the electronic components, and the operating regions of the RAM cooling mode and the ACM cooling mode.

FIG. 3 graphically shows a relationship between the low ram air speed cooling mode (RAM) and the high ram air speed cooling mode (ACM) plotted on a grid of air exit temperature (Temp.2) versus aircraft speed at a constant altitude of approximately 10,000 feet. Point 44 is the intersection point between line 45 which is a curve representing the RAM cooling mode and line 47 which is a curve representing the ACM cooling mode. Vertical line 43 is the boundary between the two cooling regions. The RAM cooling region is shown in the shaded area to the left of ordinate line 43 and below curve line 45. The ACM cooling region is shown in the shaded area to the right of line 43 and below curve line 47.

Figure 4:
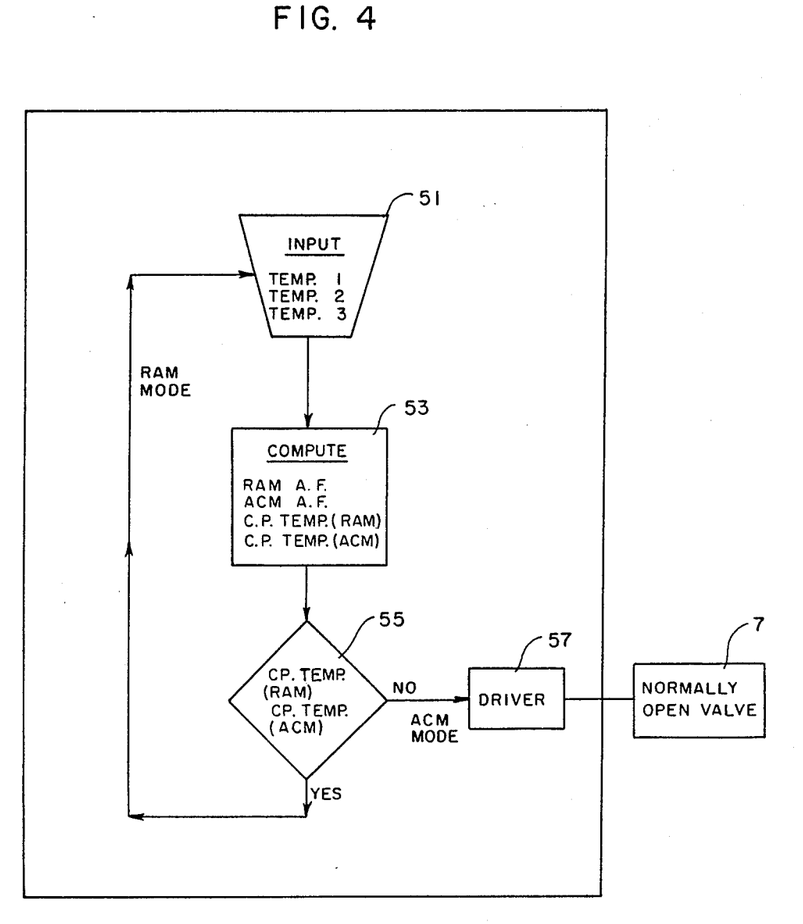
FIG. 4 is a flow chart for the logic decided by the logic module shown in FIG. 1.

As represented in the flow chart in FIG. 4, the logic module 17 performs computations which represent the cooling efficiency of the electronic components 6 in the low ram air speed cooling mode and the cooling efficiency of the electronic components 6 in the high ram air speed cooling mode. The logic module receives signals representing temperature inputs (Temp.1), (Temp.2), and (Temp.3) from temperature sensors 35, 37, and 39 respectively. The logic module 17 then performs computations representing cooling efficiencies and compares the efficiencies of the low ram air speed cooling mode versus the high ram air speed cooling mode. The more efficient cooling mode is selected by the logic module, and the valve 7 is controlled accordingly. The high speed cooling mode diverts ram air 3 to the turbine 9 to be precooled. The low speed cooling mode sends ram air 3 directly to the electronic components 6. Inputs to the logic module are represented in input function block 51 in FIG. 4.

The computations performed by the logic module 17 for the cooling efficiencies are represented in computation function block 53 in FIG. 4.

The computations performed by the logic module 17 for the low ram air speed mode may be based on the following algorithm where CP.Temp.(RAM), representing the temperature at a designated cold plate in the low ram air speed mode, represents the cooling efficiency in the low ram air speed mode:

$$CP.Temp.(RAM) = (Temp.3) + \frac{Constant(2)}{CP.Ram\ A.F.} + \frac{Constant(3)}{(CP.Ram\ A.F.)^{0.8}}$$

wherein, $$CP.Ram\ A.F. = \frac{Designated\ cold\ plate\ power}{Total\ system\ power} \times Ram\ A.F.$$

and, $$Ram\ A.F. = \frac{Constant(1)}{(Temp.2) - (Temp.3)}$$

and wherein (Temp.2) is the temperature of the ram air 3 upon exit from the electronic components 6 at temperature sensor 37; (Temp.3) is the temperature of the ram air 3 at the source at temperature sensor 39; Constant(1) is calculated by the following formula, Constant(1)=131.6×Power(in killowatts), obtained from heat balance considerations for the whole cooling system 1 of the invention; Constant (2) is calculated from the following formula, Constant(2)=131.6×Power(in killowatts), obtained from heat balance considerations for a designated cold plate; Constant(3) relates to air film temperature rise at the designated cold plate and is related to the product of temperature change of the air film times (mass flow)$^{0.8}$; and Ram A.F. is air flow through the system in lbs./minute.

The term Constant(2)/CP.Ram A.F. is an air flow term and represents the rise in temperature of the ram air 3 in flowing through the cooling system 1 with respect to an arbitrarily designated cold plate. The term Constant(3)/(CP.Ram A.F.)$^{0.8}$ is a heat transfer term and represents a rise in temperature of the air with respect to a fin on the specifically designated cold plate. More particularly, a specific cold plate is arbitrarily designated, and one has to calculate the temperature of the surface of the designated cold plate relative to the air. Having determined the absolute air temperature, the term Constant(3)/(CP.Ram A.F.)$^{0.8}$ would be added to represent the air to cold plate temperature rise.

The computations performed by the logic module 17 for the high ram air speed mode may be based on the following algorithm where CP.Temp.(ACM), representing the temperature at a designated cold plate in the high ram air speed mode, represents the cooling efficiency in the high ram air speed mode:

$$CP.Temp.(ACM) =$$

$$(\text{Temp.2}) + \frac{\text{Constant(2)}}{(CP.ACM\ A.F.)} + \frac{\text{Constant(3)}}{(CP.ACM\ A.F.)^{0.8}}$$

wherein, $$CP.ACM\ A.F. = \frac{\text{Designated cold plate power}}{\text{Total system power}} \times ACM\ A.F.$$

and, $$ACM\ A.F. = \frac{\text{Constant(1)}}{(\text{Temp.2}) - (\text{Temp.1})}$$

and wherein (Temp.2) is the temperature of the ram air 3 upon exit from the electronic components 6 at temperature sensor 37; (Temp.1) is the temperature of the ram air 3 just prior to entry of the housing for the electronic components 6 measured by temperature sensor 35; Constant(1) is calculated by the following formula, Constant (1) = 131.6 × Power(in killowatts), obtained from heat balance considerations for the whole cooling system 1; Constant (2) is calculated the following formula, Constant(2) = 131.6 × Power(in killowatts), obtained from heat balance considerations for a designated cold plate; and ACM A.F. is air flow in lbs./minute. Constant(3) relates to air film temperature rise at the designated cold plate and is related to the product of temperature change of the air film times (mass flow)$^{0.8}$.

The term Constant(2)/(CP.ACM A.F.) is an air flow term and represents the rise in temperature of the ram air 3 in flowing through the cooling system 1 with respect to an arbitrarily designated cold plate. The term Constant(3)/(CP.ACM A.F.)$^{0.8}$ is a heat transfer term and represents a rise in temperature of the air with respect to a fin on the specifically designated cold plate. More particularly, a specific cold plate is arbitrarily designated, and one has to calculate what the temperature of the surface of the designated cold plate is relative to the air. Having determined the absolute air temperature, the term Constant(3)/(CP.ACM A.F.)$^{0.8}$ would be added to represent the air to cold plate temperature rise.

An example is herein provided to represent a typical computation for CP.Temp.(ACM). A similar computation would be made for CP.Temp.(RAM).

The following information is given about the parameters for the system:

Power (system) = 4.7 kw;
Power (designated cold plate) = 0.10 kw;
Temp. 1 = 30 deg. C. (at housing inlet 11);
Temp. 2 = 50 deg. C. (at housing outlet 27); and
Temp. 3 = 45 deg. C. (at ram air inlet 13 or 19).
Constant(3) = 7.15 based on a 10 degree temperature rise and a mass flow of 0.657 lb/min.

Carrying out the calculations:

Constant(1) = 131.6 × 4.7 = 618.52;

$$ACM\ A.F. = \frac{\text{Constant(1)}}{(\text{Temp.2}) - (\text{Temp.1})} = \frac{618.52}{(50-30)} = 30.9\ \text{lb/min}$$

The 30.9 lb/min is not the designated cold plate flow. The designated cold plate flow is calculated based upon the ratio of designated cold plate power to total system power. More specifically, $$CP.ACM\ A.F. = \frac{\text{Designated cold plate power}}{\text{Total system power}} \times ACM\ A.F.$$

wherein, $$CP.ACM\ A.F. = \frac{0.10}{4.7} \times ACM\ A.F. = 0.657$$

Now, $$\frac{\text{Constant(2)}}{CP.ACM\ A.F.} = \frac{131.6 \times 0.10}{0.657} = 20\ \text{deg. C.}$$

Now for the remainder of the pertinent equation, the air film temperature rise is:

$$\frac{\text{Constant(3)}}{(CP.ACM\ A.F.)^{0.8}} = \frac{7.15}{(0.657)^{0.8}} = 10\ \text{deg. C.}$$

Thus, from the above exemplary computations,

CP.Temp(ACM) = 50 + 20 + 10 = 80 deg. C.

After computation of CP.Temp.(RAM) and CP.Temp.(ACM), the two values are compared as represented in decision function block 55 in FIG. 4. When CP.Temp.(RAM) is greater than CP.Temp.(ACM), the cooling efficiency of the electronic components is greater for the low ram air speed mode than for the high ram air speed mode. When this condition prevails, the "yes" output of block 55 is activated, and the logic module 17 permits the normally open valve 7 to remain open. However, if the valve 7 had been closed after an earlier computation, then the logic module 17 automatically opens the valve 7 thereby switching from the high ram air speed mode to the low ram air speed mode.

However, when CP.Temp.(ACM) is greater than CP.Temp.(RAM), the cooling efficiency of the electronic components 6 is greater for the high ram air speed mode than for the low ram air speed mode. When this condition prevails, the "no" output of block 55 is activated, and the logic module 17 activates unidirectional driver 57 which causes the valve 7 to be closed thereby causing incoming ram air 3 to pass through turbine 9 for precooling the air prior to reaching the electronic components 6. In this way the logic module 17 automatically switches from the low ram air speed mode to the high ram air speed mode. The driver 57 serves to receive a relatively low level "yes" signal in the logic module 17 and boost that "yes" signal to a higher level so it can drive the automatically controlled valve 7.

Alternatively, the automatically controlled valve 7 can be provided with a position sensor (not shown) which senses the mode position of the valve 7. The signal from the position sensor can be used in conjunction with the output of the decision block 55 and in conjunction with a bidirectional valve driver (not shown) to actively switch the mode positions of valve 7 back and forth between mode positions.

In the boundary cases where CP.Temp.(ACM) is equal to CP.Temp.(RAM), then the logic module 17 need not switch the valve 7 from its current position whether it be for the low speed mode or the high speed mode.

In operation of the cooling system 1 of the invention, temperatures (Temp.1), (Temp.2), and (Temp.3) are read periodically, and the computations for Ram A.F., ACM A.F., CP.Temp.(RAM), and CP.Temp.(ACM) are computed periodically. Also, the decision in comparing CP.Temp.(RAM) and CP.Temp.(ACM) is made periodically to provide periodic control of the valve 7 for automatically switching from the low ram air speed mode to the high ram air speed mode and vice versa. The frequency of temperature reading, computation, decision, and valve control can be selected and programmed as desired.

The logic module 17 is programmable thereby permitting flexibility in the the number of inputs and the frequency of sampling the inputs. Programmability also permits flexibility in the algorithms used in the calculations, and permits flexibility in other criteria that are used for controlling the valve 7.

If desired, the logic module 17 can be implemented by a programmable digital computer which is interfaced to the temperature sensors 35, 37, and 39 and to the controllable valve 7 through driver 57. A suitable higher level language for programming the digital computer is the "Basic" language. Otherwise, assembler or machine language can be used.

With respect to the air flow rates Ram A.F. and ACM A.F., extensive analysis on a thermal model for an electronic pod operating in RAM and ACM modes reveals that a known relationship exists between system flow rates so that knowing one flow rate leads to a determination of the other. There is a 2.2 ratio of Ram A.F. at all altitudes and speeds compared to ACM A.F. The variation from the 2.2 factor is (+) or (−) 8% in flow, which at low flow rates, translates into a (+) or (−) 2.5 deg. Cent. cold plate variance and at high flow rates into a 1.5 deg. Cent. variance. Both of these variances are acceptable in terms of acceptable system performance. Other specific models or embodiments of the cooling system 1 of the invention would bring about a ratio that differs from 2.2 ratio.

As indicated above, the constant Constant(1) is calculated from an equation which represents overall cold plate power dissipation. Constant(2) is calculated from an equation which represents power dissipated at a specifically designated cold plate. Constant(3) relates to air film temperature rise at the designated cold plate and is related to the product of temperature change of the air film times (mass flow)$^{0.8}$. As such, Constant(1), Constant(2), and Constant(3) would change for different power considerations. More specifically, if a cold plate dissipates 100 watts, the Constant(2) and Constant(3) may have one set of values. However, if the cold plate dissipates 400 watts, Constant(2) and Constant(3) would change. In this respect, the computations in the logic module 17 would also change for cold plates having different energy levels, and the corresponding switchover points from RAM to ACM and vice versa would change correspondingly for different power dissipation configurations. The programmable nature of the logic module 17 permits easy alteration of the calculations and switchover points.

Obviously, many modifications and variations of the present invention are possible in light of the above teachings. It is therefore to be understood that within the scope of the appended claims the invention may be practiced otherwise than as specifically described.

What is claimed is:

1. A cooling system using a supply of a variable velocity cooling fluid for cooling heat producing elements, comprising:
   controllable valve means for selectively conducting the cooling fluid directly to the heat producing elements or conducting the cooling fluid to cooling means for precooling the cooling fluid prior to contact with the heat producing elements;
   means for comparing cooling efficiency by direct cooling of the heat producing elements by the cooling fluid with cooling efficiency by precooled cooling fluid of the heat producing elements.
   means, controlled by said comparing means, for controlling said controllable valve means.

2. The cooling system described in claim 1 wherein the cooling fluid used to cool the heat producing elements directly is relatively low speed cooling fluid.

3. The cooling system described in claim 1 wherein the cooling fluid that is precooled prior to cooling the heat producing elements is relatively high speed cooling fluid.

4. The cooling system described in claim 1 wherein the variable velocity cooling fluid is ram air in an airplane in flight.

5. The cooling system described in claim 1 wherein the heat producing elements are electronic components.

6. The cooling system described in claim 1 wherein said cooling means extracts energy from the cooling fluid thereby precooling the cooling fluid.

7. The cooling system described in claim 6 wherein said energy extracting cooling means is a turbine that drives a compressor, said turbine being driven by relatively high speed cooling fluid which is precooled upon leaving said turbine.

8. The cooling system described in claim 7 wherein said compressor compresses the cooling fluid after the cooling fluid contacts the heat producing elements thereby being heated and prior to discharge of the heated cooling fluid from the system.

9. The cooling system described in claim 1 wherein the cooling efficiencies are calculated from algorithms in a logic module that receives signals from temperature sensors, said signals representing temperature measurements of the cooling fluid.

10. The cooling system described in claim 1 wherein said cooling efficiency comparing means include:
   first means for sensing the temperature of the cooling fluid, said first means sensing a first temperature of the cooling fluid, said first temperature being just prior to cooling the heat producing elements, said first means providing a first signal representing the first sensed temperature;
   second means for sensing the temperature of the cooling fluid, said second means sensing a second temperature of the cooling fluid, said second temperature being after cooling the heat producing elements, said second means providing a second signal representing the second sensed temperature;
   third means for sensing the temperature of the cooling fluid, said third means sensing a third temperature of the cooling fluid, said third temperature being at a fluid source, said third means providing a third signal representing the third sensed temperature;
   programmable means for computing the cooling efficiency of cooling fluid that is used for direct cooling of the heat producing elements, said programmable means carrying out computations based upon the first, second, and third temperature signals,
   said programmable means also for computing the cooling efficiency of cooling fluid that is precooled prior to cooling the heat producing elements, said programmable means carrying out computations based upon the first, second, and third temperature signals, said programmable means also for comparing the cooling efficiency of nonprecooled cooling fluid to the cooling efficiency of precooled cooling fluid and for automatically controlling said controllable valve means.

11. A cooling system for cooling electronic components using a supply of variable velocity ram air ranging from low speed to high speed, the system including:
   means for automatically switching from a ram air cooling mode in which the ram air is precooled prior to cooling the electronic components to a ram air cooling mode in which the ram air is not precooled prior to cooling the electronic components, said automatic cooling mode switching means comprising:
   automatically controlled valve means having a first position for conducting ram air to cooling means for precooling the ram air prior to contact with the electronic components, and having a second position for permitting ram air to directly contact the electronic components, the ram air serving to cool the electronic components,
   means for comparing a cooling efficiency of cooling the electronic components by directly cooling ram air with a cooling efficiency of cooling the electronic components by precooled ram air, and
   means for controlling said controllable valve means with respect to the first and second valve positions, said controlling means being controlled by said comparing means.

12. The cooling system described in claim 11 wherein the ram air which cools the electronic components directly is relatively low speed ram air.

13. The cooling system described in claim 11 wherein the ram air that is precooled before cooling the electronic components is relatively high speed ram air.

14. A method for cooling electronic components in an aircraft, comprising the steps of:
   intaking variable speed ram air, varying between high speed and low speed;
   computing a cooling efficiency of the electronic components by ram air directly,
   computing a cooling efficiency of the electronic components by precooled ram air,
   obtaining a comparison of the cooling efficiency of the electronic components by ram air directly with the cooling efficiency of the electronic components by precooled ram air,
   automatically selecting cooling the electronic components directly by ram air or automatically selecting cooling the electronic components by precooled ram air based on the comparison of cooling efficiencies.

15. A cooling system using a supply of a variable velocity ram air for cooling electronic components, comprising:
   controllable valve means for selectively conducting or not conducting the ram air to an energy extracting turbine means for precooling the ram air prior to contact with the electronic components;
   means for comparing a cooling efficiency of relatively low speed non-precooled ram air with a cooling efficiency of relatively high speed, precooled ram air,
   means, controlled by said comparing means, for controlling said controllable valve means.

16. The cooling system described in claim 15 wherein the cooling efficiency of nonprecooled ram air is determined by the cold plate temperature of the electronic components calculated in accordance with the following algorithm:

$$CP.\text{Temp.}(RAM) = (\text{Temp.3}) + \frac{\text{Constant}(2)}{CP.Ram\ A.F.} + \frac{\text{Constant}(3)}{(CP.Ram\ A.F.)^{0.8}}$$

wherein, $$CP.Ram\ A.F. = \frac{\text{Designated cold plate power}}{\text{Total system power}} \times Ram\ A.F.$$

and, $$Ram\ A.F. = \frac{\text{Constant}(1)}{(\text{Temp.2}) - (\text{Temp.3})}$$

and,
   (Temp.2) is the temperature of the ram air upon exit from the electronic components;
   (Temp.3) is the temperature of the ram air at a ram air source;
   Constant (1) = 131.6 × Power(in killowatts), obtained from heat balance considerations for the whole system;
   Constant(2) = 131.6 × Power(in killowatts), obtained from heat balance considerations for a designated cold plate; and
   Constant(3) relates to air film temperature rise at the designated cold plate and is related to the product of temperature change of the air film times (mass flow)$^{0.8}$; and
   Ram A.F. is ram air flow in the system in lbs./minute.

17. The cooling system described in claim 15 wherein the cooling efficiency of precooled ram air is determined by the cold plate temperature of the electronic components calculated as follows:

$$CP.\text{Temp.}(ACM) = (\text{Temp.2}) + \frac{\text{Constant}(2)}{(CP.ACM\ A.F.)} + \frac{\text{Constant}(3)}{(CP.ACM\ A.F.)^{0.8}}$$

wherein, $$CP.ACM\ A.F. = \frac{\text{Designated cold plate power}}{\text{Total system power}} \times ACM\ A.F.$$

and, $$ACM\ A.F. = \frac{\text{Constant}(1)}{(\text{Temp.2}) - (\text{Temp.1})}$$

and wherein,
   (Temp.2) is the temperature of the ram air upon exit from the electronic components;
   (Temp.1) is the temperature of the ram air just prior to cooling the electronic components;
   Constant (1) = 131.6 × Power(in killowatts), obtained from heat balance considerations for the whole system;
   Constant(2) = 131.6 × Power(in killowatts), obtained from heat balance considerations for a designated cold plate;
   Constant(3) relates to air film temperature rise at the designated cold plate and is related to the product of temperature change of the air film times (mass flow)$^{0.8}$; and ACM A.F. is ram air flow in the system in lbs./minute.

18. The cooling system described in claim 15 wherein said turbine means drives means for compressing the ram air after contact with the electronic components prior to discharge of the heated ram air from the system.

19. A cooling system using a supply of variable velocity ram air for cooling heat producing electronic components, comprising:

controllable valve means for selectively conducting ram air directly to the electronic components or conducting the ram air to an energy extracting turbine means for precooling the ram air prior to contact with the electronic components;

means for comparing a cooling efficiency of relatively low speed ram air with a cooling efficiency of relatively high speed, precooled ram air, said comparing means including:

first means for sensing the temperature of the cooling fluid, said first means sensing a first temperature of the cooling fluid, said first temperature being just prior to cooling the heat producing elements, said first means providing a first signal representing the first sensed temperature;

second means for sensing the temperature of the cooling fluid, said second means sensing a second temperature of the cooling fluid, said second temperature being after cooling the heat producing elements, said second means providing a second signal representing the second sensed temperature;

third means for sensing the temperature of the cooling fluid, said third means sensing a third temperature of the cooling fluid, said third temperature being at a fluid source, said third means providing a third signal representing the third sensed temperature;

programmable means for computing the cooling efficiency of cooling fluid that is used for direct cooling of the heat producing elements, said programmable means carrying out computations based upon the first, second, and third temperature signals, said programmable means also for computing the cooling efficiency of cooling fluid that is precooled prior to cooling the heat producing elements, said programmable means carrying out computations based upon the first, second, and third temperature signals, and said programmable means also for comparing the cooling efficiency of nonprecooled cooling fluid to the cooling efficiency of precooled cooling fluid and for automatically controlling said controllable valve means, and means, controlled by said comparing means, for controlling said controllable valve means.

* * * * *